(12) United States Patent
Huotari et al.

(10) Patent No.: US 8,252,703 B2
(45) Date of Patent: Aug. 28, 2012

(54) METHODS FOR FORMING ROUGHENED SURFACES AND APPLICATIONS THEREOF

(75) Inventors: Hannu Huotari, Espoo (FI); Suvi Haukka, Helsinki (FI)

(73) Assignee: ASM International N.V. (NL)

( * ) Notice: Subject to any disclaimer, the term of this patent is extended or adjusted under 35 U.S.C. 154(b) by 0 days.

(21) Appl. No.: 13/084,254

(22) Filed: Apr. 11, 2011

(65) Prior Publication Data

US 2011/0256722 A1  Oct. 20, 2011

Related U.S. Application Data

(62) Division of application No. 12/368,845, filed on Feb. 10, 2009, now Pat. No. 7,923,382, which is a division of application No. 11/414,510, filed on Apr. 28, 2006, now Pat. No. 7,491,634.

(51) Int. Cl.
H01L 21/469  (2006.01)

(52) U.S. Cl. . 438/785; 438/782; 438/795; 438/E21.279; 438/E21.013

(58) Field of Classification Search .......... 438/782–785, 438/680, 695; 997/742, 773; 977/742, 773
See application file for complete search history.

(56) References Cited

U.S. PATENT DOCUMENTS

| | | |
|---|---|---|
| 3,405,801 A | 10/1968 | Zwiacher et al. |
| 4,058,430 A | 11/1977 | Suntola et al. |
| 4,477,296 A | 10/1984 | Nair |
| 5,372,962 A | 12/1994 | Hirota et al. |
| 5,382,333 A | 1/1995 | Ando et al. |
| 5,453,494 A | 9/1995 | Kirlin et al. |
| 5,711,811 A | 1/1998 | Suntola et al. |
| 5,731,634 A | 3/1998 | Matsuo et al. |
| 5,865,365 A | 2/1999 | Nishikawa et al. |
| 5,916,365 A | 6/1999 | Sherman |
| 5,939,334 A | 8/1999 | Nguyen et al. |
| 6,006,763 A | 12/1999 | Mori et al. |
| 6,033,584 A | 3/2000 | Ngo et al. |
| 6,066,892 A | 5/2000 | Ding et al. |
| 6,090,666 A | 7/2000 | Ueda et al. |
| 6,124,189 A | 9/2000 | Watanabe et al. |
| 6,130,123 A | 10/2000 | Liang et al. |

(Continued)

FOREIGN PATENT DOCUMENTS

DE  41 08 73  8/1923

(Continued)

OTHER PUBLICATIONS

Aaltonen et al., "Atomic Layer Deposition of Noble Metal Thin Films," dissertation presented at the University of Helsinki, Helsinki, Finland, 2005.

(Continued)

*Primary Examiner* — Dung A. Le
(74) *Attorney, Agent, or Firm* — Knobbe, Martens, Olson & Bear, LLP

(57) ABSTRACT

Methods of forming a roughened metal surface on a substrate are provided, along with structures comprising such roughened surfaces. In preferred embodiments roughened surfaces are formed by selectively depositing metal or metal oxide on a substrate surface to form discrete, three-dimensional islands. Selective deposition may be obtained, for example, by modifying process conditions to cause metal agglomeration or by treating the substrate surface to provide a limited number of discontinuous reactive sites. The roughened metal surface may be used, for example, in the manufacture of integrated circuits.

22 Claims, 5 Drawing Sheets

U.S. PATENT DOCUMENTS

| | | | |
|---|---|---|---|
| 6,303,500 B1 | 10/2001 | Jiang et al. | |
| 6,323,131 B1 | 11/2001 | Obeng et al. | |
| 6,342,277 B1 | 1/2002 | Sherman | |
| 6,346,151 B1 | 2/2002 | Jiang et al. | |
| 6,433,432 B2 | 8/2002 | Shimizu | |
| 6,444,868 B1 | 9/2002 | Vaughn et al. | |
| 6,482,740 B2 | 11/2002 | Soininen et al. | |
| 6,780,704 B1 | 8/2004 | Raaijmakers et al. | |
| 6,824,816 B2 | 11/2004 | Aaltonen | |
| 6,852,635 B2 | 2/2005 | Satta et al. | |
| 6,921,712 B2 | 7/2005 | Soininen et al. | |
| 7,105,054 B2 | 9/2006 | Lindfors | |
| 7,108,747 B1 | 9/2006 | Leskela et al. | |
| 7,118,779 B2 | 10/2006 | Verghese et al. | |
| 7,438,949 B2 | 10/2008 | Weidman | |
| 7,491,634 B2 | 2/2009 | Huotari et al. | |
| 7,704,896 B2 | 4/2010 | Haukka et al. | |
| 7,923,382 B2 | 4/2011 | Huotari et al. | |
| 2001/0003064 A1 | 6/2001 | Ohto | |
| 2001/0018266 A1 | 8/2001 | Jiang et al. | |
| 2001/0052318 A1 | 12/2001 | Jiang et al. | |
| 2002/0013487 A1 | 1/2002 | Norman et al. | |
| 2002/0027286 A1 | 3/2002 | Sundararajan et al. | |
| 2003/0165615 A1 | 9/2003 | Aaltonen et al. | |
| 2004/0005753 A1 | 1/2004 | Kostamo et al. | |
| 2004/0214354 A1 | 10/2004 | Marsh et al. | |
| 2004/0256662 A1 | 12/2004 | Black et al. | |
| 2005/0048794 A1 | 3/2005 | Brask et al. | |
| 2005/0069648 A1* | 3/2005 | Maruyama | 427/379 |
| 2005/0089632 A1 | 4/2005 | Vehkamaki et al. | |
| 2005/0092247 A1 | 5/2005 | Schmidt et al. | |
| 2005/0271813 A1 | 12/2005 | Kher et al. | |
| 2006/0046384 A1 | 3/2006 | Joo et al. | |
| 2006/0121733 A1 | 6/2006 | Kilpela et al. | |
| 2006/0252244 A1* | 11/2006 | Vaartstra et al. | 438/608 |
| 2007/0014919 A1 | 1/2007 | Hamalainen et al. | |
| 2007/0026654 A1 | 2/2007 | Huotari et al. | |
| 2007/0036892 A1 | 2/2007 | Haukka et al. | |
| 2007/0148347 A1 | 6/2007 | Hatanpaa et al. | |

FOREIGN PATENT DOCUMENTS

| | | |
|---|---|---|
| EP | 0469470 A1 | 2/1992 |
| EP | 0511264 B2 | 8/1995 |
| EP | 0880168 A2 | 11/1998 |
| GB | 2 340 508 A | 2/2000 |
| WO | WO 93/10652 | 5/1993 |
| WO | WO 00/03420 | 1/2000 |

OTHER PUBLICATIONS

Aaltonen et al., "Atomic Layer Deposition of Platinum Thin Films," *Chem. Mater.* 15:1924-1928 (2003).

Baliga, J., "New Designs and Materials Tackle 1 Gb Memory Challenge," Semiconductor International, World Wide Web address: semiconductor.net, Nov. 2000.

Basceri, C., "Electrial Dielectric Properties of (Ba,Sr) $TiO_3$ Thin Film Capacitors for Ultra-High Density Dynamic Random Access Memories", Thesis, 1997.

Haukka et al., "Chemisorption of Chromium Acetylacetonate on Porous High Surface Area Silica," *Appl. Surface Science* 75:220-227 (1994).

Haukka and Root, "The Reaction of Hexamethyldisilazane and Subsequent Oxidation of Trimethylsilyl Groups on Silica Studied by Solid-State NMR and FTIR," *J. Phys. Chem.* 98:1695-1703 (1994).

Kwon et al., "Ruthenium Bottom Electrode Prepared by Electroplating for a High Density DRAM Capacitor," J. Electrochem. Soc. 151(2): C127-C132 (2004).

Liu et al., "Metal Nanocrystal Memories—Part I: Device Design and Fabrication," *IEEE Transactions on Electron Devices* 49(9): 1606-1613 (2002).

Liu et al., "Metal Nanocrystal Memories—Part II: Electrical Characteristics," *IEEE Transactions on Electron Devices* 49(9): 1614-1622 (2002).

Parsons et al., "Microcontact Patterning of Ruthenium Gate Electrodes by Selective Area," North Carolina State university, presentation at AVS conference on Atomic Layer Deposition (ALD 2004), Helsinki, Finland, Aug. 16, 2004.

SOI Technology: IBM's Next Advance in Chip Design, 1998.

Ren et al. "Low temperature carbon nanotubes growth on Ni-$CF_2$ coated sodalime glass substrate using thermal CVD method" Vacuum Electron Sources Conference (2004), pp. 159-162.

Nasibulin et al. "An essential role of $CO_2$ and $H_2O$ during single-walled CNT synthesis from carbon monoxide" Chemical Physics letters 417 (2006) 179-184.

\* cited by examiner

METHODS FOR FORMING ROUGHENED SURFACES AND APPLICATIONS THEREOF

REFERENCE TO RELATED APPLICATIONS

The present application claims priority under 35 U.S.C. §120 as a divisional of U.S. application Ser. No. 12/368,845 filed Feb. 10, 2009, now issued as U.S. Pat. No. 7,923,382, which is a divisional of U.S. application Ser. No. 11/414,510 filed Apr. 28, 2006, now issued as U.S. Pat. No. 7,491,634, both of which are hereby incorporated by reference in their entirety.

BACKGROUND OF THE INVENTION

1. Field of the Invention

The invention generally relates to roughened metal surfaces that can be used, for example, in integrated circuits. More particularly, methods for depositing roughened thin films and particles and controlling the roughness of metal thin films are provided, along with structures incorporating such films and particles.

2. Description of the Related Art

When fabricating integrated circuits, layers of insulating, conducting and semiconducting materials are deposited and patterned layer by layer. Many types of circuits incorporate capacitors, each of which includes a dielectric layer sandwiched between two plates (or electrodes). Memory chips such as dynamic random access memories (DRAMs), in particular, employ capacitors to store charge in memory cells. Each memory cell can represent one bit of data, where the capacitor can either be charged or discharged to represent logical states.

In accordance with the general trend in the semiconductor industry, integrated circuits are continually being reduced in size in order to achieve higher processing speeds and lower power consumption. Because a capacitor in a memory cell of a memory chip must store a certain minimum charge, to ensure reliable operation of the memory cell without the need for excessive refresh cycling, with IC size reduction and concomitant increase in packing density of memory chips, it is important that capacitors be able to store more charge per area of the chip (or footprint) allotted to each cell. Techniques have been developed to increase the total charge capacity of the cell capacitor for a given footprint.

The amount of charge stored on the capacitor is proportional to the capacitance, $C=kk_0 A/d$, where 'k' is the permittivity (or dielectric constant) of the dielectric material between the two electrodes of the capacitor, '$k_0$' is the vacuum permittivity, 'A' is the effective surface area of the electrodes, and 'd' is the spacing between the electrodes, also representing the thickness of the inter-electrode dielectric.

Rather than relying solely upon the height (or depth) of the cell capacitor, techniques have focused on increasing the effective surface area (A) of the electrodes by creating folding structures for stacked capacitors or trench capacitors. Trench capacitors are formed within the semiconductor substrate in which transistors are typically formed, whereas stacked capacitors are formed above the transistors. Such structures better utilize the available chip area by creating three-dimensional shapes which the conductive electrodes and capacitor dielectric conform to.

As an alternative, a microstructure can further increase the effective surface area of the capacitor electrodes by providing a textured or roughened surface to the macrostructural folds of the lower electrode. For example, polycrystalline conductive materials can be roughened by preferentially etching along grain boundaries, as disclosed, for example, in U.S. Pat. No. 3,405,801, issued to Han et al. Alternatively, U.S. Pat. No. 5,372,962, issued to Hirota et al., describes various selective etch processes for perforating a polysilicon layer.

Another class of electrode texturing techniques involves forming hemispherical grained (HSG) silicon. Several methods for forming HSG silicon are known, including direct deposition, whereby deposited polysilicon selectively grows over nucleation sites, and redistribution annealing of amorphous silicon, whereby thermal energy causes silicon atoms to migrate across a surface and agglomerate at distinct nucleation sites.

Traditionally HSG electrodes have consisted of polysilicon material, which suffers from depletion effects, thereby increasing the effective oxide thickness (EOT) typically by about 3-5 Å or more. By replacing polysilicon with a metal or a metallic compounds (or other electrically conductive material), the depletion effect can be avoided. Noble metals, such as ruthenium, are leading candidates for the electrodes of metal-insulator-metal (MIM) capacitors.

SUMMARY OF THE INVENTION

In one aspect of the invention, methods for forming a roughened surface are provided. In preferred embodiments the methods comprise forming a discontinuous surface termination on the substrate and forming islands of metal or metal oxide on the surface.

Atomic layer deposition (ALD) processes are preferably used to deposit metal or metal oxide on the reactive sites on the substrate surface using alternating and sequential pulses of a metal source chemical and an oxygen-containing species.

In yet another aspect of the invention, methods for forming a roughened surface are provided In which islands of conductive material, such as metal or metal oxide, are formed on the surface using process conditions selected to effect metal particle agglomeration.

In still another aspect of the invention, methods for forming a capacitor are provided. The methods comprise providing a substrate in a reaction space. Three-dimensional islands of conductive material are formed on a surface of the substrate. A layer of a high-k material is deposited over the metal atoms. The conductive material may be metal or conductive metal oxide.

In still another aspect of the invention, a capacitor in an integrated circuit (IC) is described. The capacitor comprises a substrate having three-dimensional islands of conductive material on a surface thereof, wherein the concentration of islands is between about 0.001 particles/nm$^2$ to 10 particles/nm$^2$. A layer of a high-k material is disposed over the surface.

DETAILED DESCRIPTION OF THE PREFERRED EMBODIMENTS

Figure 1:
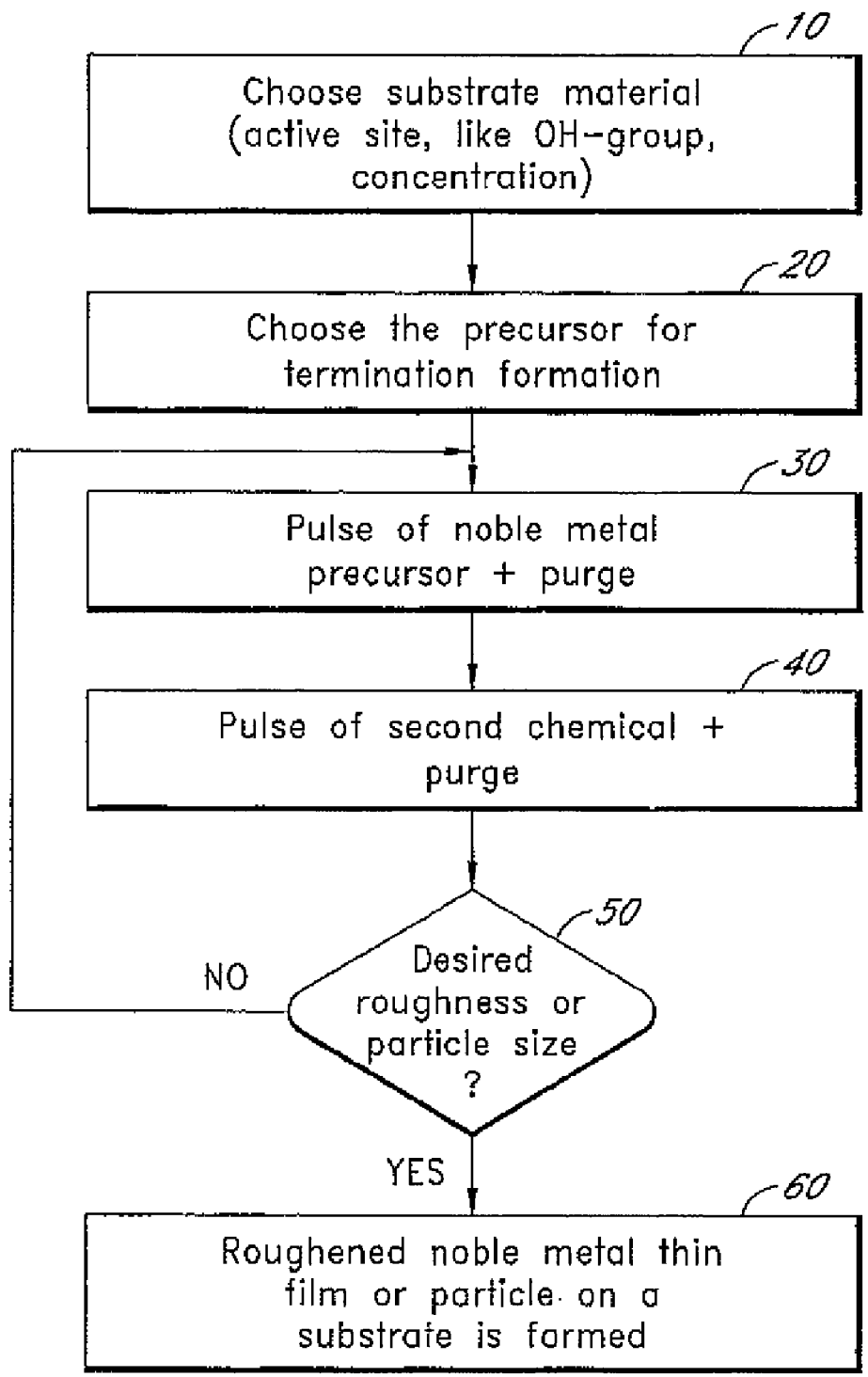
FIGS. 1 and 2 are process flow diagrams for forming a roughened surface, according to several embodiments of the invention.

In many applications there are advantages to be gained from the use of roughened metal (e.g., Ru) surfaces. For example, they can be used in capacitor electrodes. However, methods for forming roughened metal thin films, particularly films with predetermined particle size distributions, are lacking in the art. Accordingly, there is a need for methods of controllably forming roughened thin films, particularly roughened metal thin films. Such thin films can serve, for example, as nucleation points for nanotubes, which in turn can serve as, e.g., components of non-volatile memory devices.

Preferred embodiments of the invention provide methods for forming roughened metal thin films on a substrate. Although referred to as thin films, in some embodiments the roughened metal thin films are not continuous, but rather comprise islands of metal at distinct sites on the surface, while other sites do not contain metal. In other embodiments the roughened metal thin films comprise islands of metal at distinct sites, while other sites on the surface comprise less metal. That is, although metal may be present at all sites on the surface, the thickness of the metal varies across the surface and is greatest at the islands. The metal islands are preferably three-dimensional structures and comprise metal "particles" or "grains."

The skilled artisan will appreciate that in addition to elemental metal films, other types of roughened films comprising one or more metals can be formed. Thus, in some embodiments elemental metal films are formed, while in other embodiments metal oxide or other compound metal films are formed. As used herein, the term "metal thin film" indicates that the film comprises at least one metal.

The concentration of islands (or particles) is preferably between about 0.001 particles/nm$^2$ to 10 particles/nm$^2$, more preferably between about 0.01 particles/nm$^2$ to 5 particles/nm$^2$, still more preferably between about 0.05 particles/nm$^2$ to 2 particles/nm$^2$, and most preferably between about 0.1 particles/nm$^2$ to 1.5 particles/nm$^2$.

In some embodiments, the particle concentration is determined, in part, by the initial surface concentration. As an example, a surface can be treated with a blocking agent (e.g., hexamethyldisilazane) prior to particle deposition as discussed in more detail below. As a result, the particle concentration following deposition may be lower than that obtained for an untreated surface. In some embodiments, depending on the surface termination, the particle concentration could be less than about 0.001 particles/nm$^2$.

The spacing between particles, and hence the concentration, also depends in part on the particle size and shape, which in turn is determined by a variety of factors, such as, e.g., the reaction mechanism used to form the particles and the initial surface termination. Examples of particle shapes include, without limitation, laterally wide (or flat), substantially spherical, hemispherical, cubical, cylindrical and triangular.

In some embodiments, roughened surfaces are formed by selectively depositing metal or metal oxide particles on a substrate. Selective deposition can be achieved by modifying a portion of potential reactive sites on the substrate surface to facilitate deposition on some surface sites relative to others. In other embodiments selective deposition is achieved by blocking or inhibiting deposition at particular sites while allowing deposition to occur at other sites.

In other embodiments, roughened surfaces are formed by choosing process conditions, such as temperature, to effect particle agglomeration. For example, a metal oxide thin film, such as a nickel or cobalt oxide thin films, can be reduced in an atmosphere chosen to cause agglomeration. In particular, agglomeration can be caused by reducing metal oxide (e.g., CuO, NiO, CoO) films at elevated temperatures. Agglomeration typically occurs at temperatures about 50° C. higher than the standard reduction temperature, preferably between about 50° C. and 400° C. higher than the reduction temperature, more preferably between about 100° C. and 250° C. higher. Reducing agents that can be employed include, without limitation, alcohols (e.g., ethanol), carboxylic acids, aldehydes, ketones, hydrogen and excited species of a reducing agent (e.g., hydrogen radicals, cations and anions).

In other embodiments, particle agglomeration is achieved by providing a surface material that promotes agglomeration. The surface material may be present on the substrate already or may be deposited prior to forming the roughened metal film. In some embodiments, by taking advantage of the selectivity of certain atomic layer deposition (ALD) metal processes, smooth thin films can be formed on one surface, such as planar portions of a surface, while a roughened thin film is grown on a second surface, such as in trenches and vias.

A substrate or workpiece to be processed according to the methods disclosed herein is placed in a reaction space within a reaction chamber. The reaction chamber may be configured for in situ plasma generation, in which excited species of a particular reactant are formed in the reaction chamber (in situ). As an alternative, excited species of a particular reactant may be formed at a location external to the reaction chamber and directed to the reaction chamber to contact the substrate.

As used herein, atomic layer deposition (ALD) refers to any vapor deposition process that is based on controlled, self-limiting reaction of precursor chemicals. In an ALD process, gas phase reactions are avoided by contacting a substrate alternately and sequentially with vapor phase reactants. Vapor phase reactants may be separated from each other in the reaction chamber, for example, by removing excess reactants and/or reactant by-products from the reaction chamber between reactant pulses. This purge step may be accomplished with an evacuation step and/or with the aid of an inactive gas pulse. In some embodiments an inactive carrier gas is used to feed the reactants into the reaction chamber and also serves as the purge gas to push excess reactants and/or reaction byproducts out of the reaction chamber.

An ALD cycle preferably comprises alternating and sequential provision (or pulses) of a first and second reactant. Depending on the nature of the film to be formed, additional reactants may be included. The first reactant is conducted into the chamber in the form of vapor phase pulse, optionally with the aid of a carrier gas, and contacted with the surface of the substrate. Conditions are selected such that no more than about one monolayer of the precursor is adsorbed on the substrate surface in a self-limiting manner per cycle. Excess first reactant and reaction byproducts, if any, are purged from the reaction chamber, often with a pulse of inert gas such as nitrogen or argon. In some embodiments this is accomplished by turning off the flow of reactant to an inert carrier gas, while continuing to flow the carrier gas through the chamber.

In the next phase of the ALD cycle, the second gaseous reactant is pulsed into the chamber where it reacts with the first reactant bound to the surface. Again, reactants and conditions are selected such that this step is also self-limiting. Excess second reactant and gaseous by-products of the surface reaction are removed from the reaction chamber, also preferably with the aid of an inert gas.

The steps of pulsing and purging (the ALD cycle) are repeated until a roughened thin film of the desired thickness has been formed on the substrate, with each cycle leaving no more than a molecular monolayer.

As mentioned above, each pulse or phase of each ALD cycle is preferably self-limiting. An excess of reactant precursors is supplied in each phase to saturate the susceptible substrate surfaces. Surface saturation ensures reactant occupation of all available reactive sites (subject, for example, to physical size or "steric hindrance" restraints) and thus excellent step coverage.

As mentioned above, roughened metal thin films can be formed by modifying a surface prior to ALD of metal or metal oxide particles. In some embodiments, a surface is modified by providing a surface termination that enhances deposition at particular locations, such as by treating the substrate with a halide or metalorganic reactant. These embodiments are preferably used to deposit elemental metals, particularly noble metals. However, they can be used to deposit more complex metals such as metal oxides. In other embodiments, the substrate surface is modified by blocking reactive sites, for example with HMDS. These embodiments are preferably used to deposit metal oxide particles, such as alumina or iron oxide, but can also be used to deposit elemental metals. When blocking reagents are used, water is preferably used as an oxygen source in ALD reactions to deposit metals or metal oxides.

By controlling the concentration of a particular surface termination, a roughened surface may be formed by using ALD to deposit metal or metal oxide particles at the available reactive sites. With each successive ALD cycle, the particles grow in size to yield larger particles (e.g., nanoparticles). Surface terminations that facilitate metal deposition by ALD are described in U.S. patent application Ser. No. 11/375,819, filed Mar. 14, 2006, the disclosure of which is incorporated herein by reference in its entirety.

In some embodiment, a roughened metal surface is formed on a substrate by selectively depositing metal by an ALD process at reactive sites that have been modified to facilitate deposition. The substrate surface is preferably treated first with a deposition enhancing agent, preferably a halide or metalorganic compound, to modify a portion of the surface. That is, the surface termination at a portion of possible reactive sites is modified to facilitate metal deposition.

The halide or metalorganic compound may be, for example, a metal halide, a hydrogen halide or a metalorganic compound, as described in more detail below. In some embodiments the halide is selected from the group consisting of HCl, $HfCl_4$, $AlCl_3$ and $SiCl_4$. The halide or metalorganic compound can be selected by the skilled artisan based on its ability to react with the surface on which deposition is desired at an appropriate reaction temperature. The concentration is selected to achieve the desired density of modified surface sites and hence the desired density of metal particles in the roughened film.

Excess halide or metalorganic compound is removed from the reaction chamber and multiple ALD cycles are carried out to deposit metal, preferably a noble metal, at the modified surface sites. Each cycle comprises pulsing a vaporized metal precursor into the reaction chamber to selectively adsorb on the substrate at the modified locations, purging the reaction chamber to remove excess metal precursor and reaction by-products, if any, providing a pulse of a second reactant, preferably an oxygen-containing reactant (e.g., molecular oxygen, ozone) (also "oxygen-containing precursor" and "oxygen-containing species" herein), ammonia or ammonia plasma containing gas onto the substrate, and purging the reaction chamber to remove excess second reactant and any gaseous by-products formed in the reaction between the metal precursor layer on the first surface of the substrate and the second reactant. The cycle may be repeated a predetermined number of times to achieve a desired surface roughness, which is a function of the size of the particles and their density.

The substrate can comprise various types of materials. When manufacturing integrated circuits (ICs), the substrate typically comprises a number of thin films with varying chemical and physical properties. Preferably, at least one surface comprises a metal, semiconductor or semiconductor oxide or nitride. For example, a surface may comprise silicon, polysilicon, SiGe, Ge, GaAs, silicon oxide (e.g., $SiO_2$) or a silicon nitride, such as silicon oxynitride. The substrate may comprise a high-k dielectric layer, a metal layer, and/or a metal nitride. Further, the substrate surface may have been patterned and may comprise structures such as nodes, vias and trenches.

With reference to FIG. 1, in a first phase 10 a substrate is provided in a reaction chamber configured for ALD and heated to a predetermined deposition temperature, generally at lowered pressure. Deposition temperatures are maintained below a precursor thermal decomposition temperature but at a sufficiently high level to avoid condensation of reactants and to provide the activation energy for the desired surface reactions. Of course, the appropriate temperature window for any given ALD reaction will depend upon the surface termination and reactant species involved. In some embodiments, the substrate comprises an initial surface termination (e.g., OH or $NH_2$ groups).

In a second phase 20, the substrate surface is modified to provide a surface termination that enhances metal deposition. Preferably, the surface termination does not saturate the surface. In a third phase 30, the modified surface is contacted with a metal precursor (metal source chemical) to adsorb the metal at surface sites comprising the modified surface termination. In a fourth phase 40, the surface is contacted with a second reactant, such as an oxygen-containing reactant, to form metal or metal oxide particles at surface sites comprising the modified surface termination. The third and fourth phases may be repeated 50 as desired until a surface with a desired roughness is achieved 60.

In the second phase 20, with the substrate disposed in a reaction chamber (or reaction space), a halide or metalorganic compound is exposed to the substrate surface to produce a desired concentration of modified sites. The concentration of surface termination sites can be chosen as desired by, e.g., selecting an appropriate metal halide or metalorganic compound pulsing time. For example, if the halide compound (or reactant) pulsing time required for saturation coverage is 5 seconds, sub-saturating halide coverage may be achieved by using pulsing times less than 5 seconds. The concentration of the surface termination sites can also be selected by choosing the size of the metal halide or the metalorganic compound. Additionally, heat treatment may be used to effect a desired surface termination concentration. The desired concentration of reactive sites can thus be determined for a particular reactant and reactions conditions by routine experimentation.

After treatment, halide or metalorganic surface terminations are preferably at a concentration between about 0.001 terminations/$nm^2$ to 10 terminations/$nm^2$, preferably between about 0.01 terminations/$nm^2$ to 5 terminations/$nm^2$, more preferably between about 0.05 terminations/$nm^2$ to 2 terminations/$nm^2$, most preferably between about 0.1 terminations/$nm^2$ to 1.5 terminations/$nm^2$.

The metal halide or metalorganic-terminated surface is preferably more reactive with the metal precursor than unterminated surface locations, leading to the formation of discrete islands and the desired roughened then film. In some embodiments this is achieved by decreasing the incubation time at modified sites.

The halide or metalorganic compound is not limited in any way. Halides may comprise, for example and without limitation, an element selected from the group consisting of Sc, Ti, V, Fe, Cr, Mn, Zn, B, C, Al, Si, P, Zr, Nb, Mo, In, Ga, Ge, Sn, Hf, Ta and W. The halide may also be a non-metal halide, such as HCl or $PCl_5$. In some embodiments the halide is a chlorine compound and comprises at least one chlorine atom.

If a metalorganic compound is utilized for the surface treatment, it may comprise, for example and without limitation, an element selected from the group consisting of Sc, Ti, V, Fe, Cr, Mn, Zn, B, C, Al, Si, P, Zr, Nb, Mo, In, Ga, Ge, Sn, Hf, Ta and W, and one or more ligands selected from the group consisting of substituted or non-substituted alkyl-, alkylamide-, alkoxide-, amidinate-, aryl-, betadiketonate-, imidoamido- and cyclopentadienyl-compounds. In some embodiments, the metalorganic compounds are selected from the group consisting of trimethylaluminum, tetrakis(ethylmethyl)aminohafnium, tetrakis(dimethyl)aminohafnium, tetrakis(diethyl)aminohafnium, tetrakis(ethylmethyl)aminozirconium, tetrakis(dimethyl)aminozirconium and tetrakis(diethyl)aminozirconium.

The halide or metalorganic treatment is preferably conducted at a treatment temperature such that the halide or metalorganic reactants have sufficient vapor pressure but below the temperature at which they begin to decompose. In preferred embodiments the treatment temperature is between about 0° C. and about 1000° C., more preferably between about 100° C. and about 400° C., and still more preferably between about 150° C. and about 300° C.

The halide or metalorganic treatment may be provided a single time, or may be repeated multiple times until a desired concentration of surface terminations is achieved. For example, alternating pulses of the halide or metalorganic and the metal reactant may be provided. These alternating pulses may be repeated any number of time prior to beginning the regular ALD cycles of metal precursor and second reactant as described below.

With continued reference to FIG. 1, in the third phase 30, a metal precursor is exposed (or pulsed) to the modified surface. As discussed above, the metal precursor is preferably more reactive with portions of the surface modified with metal halide or metalorganic surface terminations prepared in the second phase 20 than with unmodified portions of the surface. The metal precursor reacts in a self-limiting manner.

Gaseous precursors and/or gaseous by-products formed in the reaction are removed from the reaction chamber by evacuating the chamber with a vacuum pump and/or by purging the gas from inside the reactor with the aid of an inert gas such, as argon or nitrogen. Typical purging times are from about 0.05 to 20 seconds, more preferably between about 1 and 10, and still more preferably between about 1 and 2 seconds.

In some embodiments the metal precursor (and hence the metal particles in the roughened film) comprises one or more metals selected from the group consisting of Cr, Cu, Ni, Fe, Co, Zn, Ru, Rh, Pd, Ag, Re, Os, Ir, Pt, Mo and W. More preferably, the metal particles comprise one or more noble metals. In other embodiments, the metal precursor comprises one or more metals selected from the group consisting of Bi, Mg, Ca, Sr, Rb, Cs, Ba, Ni, Mn, Cu, Co, Ti, Ta, Zr, Hf, V, Nb, Cr, W, Mo, Sc, Y, Lu, La, Ce, Pr, Nd, Pm, Sm, Eu, Gd, Tb, Dy, Ho, Er, Tm, Yb, Fe, Zn, Sn, Sb, Cr, In, Cd, Ga, Ge, B, As, Al, Si, Ru, Rh, Pd, Ag, Re, Os, Ir, Pt, Au, Hg, and Pb. Suitable metal precursors (or source chemicals) may be selected by the skilled artisan. Preferably, metal source chemicals that are different from the halide or metalorganic compound are used.

Preferred metal precursors include cyclopentadienyl and betadiketonate metal compounds, more preferably metallocene compounds, beta-diketonate compounds and acetamidinato. Particularly preferred metal precursors are cyclopentadienyl and acetylacetonate (acac) precursor compounds. In some embodiments a bis(ethylcyclopentadienyl) metal compound is used.

When depositing ruthenium thin films or particles, preferred metal precursors may be selected from the group consisting of bis(cyclopentadienyl)ruthenium, tris(2,2,6,6-tetramethyl-3,5-heptanedionato)ruthenium and tris(N,N'-diisopropylacetamidinato)ruthenium(III) and their derivatives, such as bis(N,N'-diisopropylacetamidinato)ruthenium(II) dicarbonyl, bis(ethylcyclopentadienyl)ruthenium, bis(pentamethylcyclopentadienyl)ruthenium and bis(2,2,6,6-tetramethyl-3,5-heptanedionato)(1,5-cyclooctadiene)ruthenium(II). In preferred embodiments, the precursor is bis(ethylcyclopentadienyl) ruthenium $(Ru(EtCp)_2)$.

When depositing platinum films or particles, preferred metal precursors include (trimethyl)methylcyclopentadienylplatinum, platinum (II) acetylacetonato, bis(2,2,6,6-tetramethyl-3,5-heptanedionato)platinum(II) and their derivatives.

When depositing iridium films or particles, preferred metal precursor include tris(acetylacetonato)iridium(III) and derivates of those.

When depositing palladium films or particles, preferred metal precursors include bis(hexafluoroacetylacetonate)palladium(II).

When depositing nickel-containing films or particles, preferred metal precursors include bis(acetylacetonate)nickel (II), bis(2,2,6,6-tetramethyl-3,5-heptanedionato)nickel(II) and bis(cyclopentadienyl)nickel(II) and derivates of those.

When depositing cobalt-containing films or particles, preferred metal precursors include bis(acetylacetonate)cobalt(II), bis(2,2,6,6-tetramethyl-3,5-heptanedionato)cobalt(II) and bis(cyclopentadienyl)cobalt(II) and derivates of those.

When depositing cobalt-containing films or particles, preferred metal precursors include bis(acetylacetonate)cobalt(II), bis(2,2,6,6-tetramethyl-3,5-heptanedionato)cobalt(II) and bis(cyclopentadienyl)cobalt(II) and derivates of those.

When depositing copper-containing films or particles, preferred metal precursors include bis(acetylacetonate)copper (II) and bis(2,2,6,6-tetramethyl-3,5-heptanedionato)coppert (II) and derivates of those.

When depositing chromim-containing films or particles, preferred metal precursors include tris(acetylacetonate)chromium(III) and derivates of that.

When depositing iron-containing films or particles, preferred metal precursors include acetylacetonate compounds of iron and ferrocene compounds and derivates of those.

When depositing zinc-containing films or particles, preferred metal precursors include alkylzinc compounds, such as diethylzinc(II).

When depositing tungsten or molybdenum-containing films or particles, preferred metal precursors include metalorganic compounds, such as cyclopentadienyl-, alkylamide- and imido-amido-compounds of tungsten and molybdenum.

The metal precursor may be solid, liquid or gaseous material, provided that the metal precursor is in vapor phase before it is conducted into the reaction chamber and contacted with the substrate surface. "Pulsing" a vaporized precursor onto the substrate means that the precursor vapor is conducted into the chamber for a limited period of time. Typically, for single wafer processing the pulsing time is from about 0.05 to 10 seconds. However, depending on the substrate type and its surface area, the pulsing time may be even higher than 10 seconds, in some cases from about 10 to about 60 seconds or more. For example, for batch reactors pulse times may range from milliseconds to minutes or longer. Preferably, for a 300 mm wafer in a single wafer ALD reactor, the metal precursor is pulsed for from 0.05 to 10 seconds, more preferably for from 0.25 to 3 seconds and most preferably for about 0.5 to 2 seconds.

The mass flow rate of the metal precursor can be determined by the skilled artisan. In one embodiment, for deposition on 300 mm wafers the flow rate of metal precursor is preferably between about 1 and 1000 sccm without limitations, more preferably between about 100 and 500 sccm. The mass flow rate of the metal precursor is usually lower than the mass flow rate of the oxygen precursor, being usually between 10 and 10000 sccm without limitation, more preferably between about 100-2000 sccm and most preferably between 100-1000 sccm.

In the fourth phase 40, the surface is contacted with a second reactant, preferably an oxygen-containing reactant, to form metal or metal oxide particles on the substrate surface. An oxygen-containing reactant may be provided, for example, by pulsing diatomic oxygen gas or a mixture of oxygen and another gas into the reaction chamber.

In other embodiments, oxygen is formed inside the reactor, such as by decomposing oxygen containing chemicals. Oxygen containing chemicals that can be decomposed in the reactor to produce oxygen include, without limitation, $H_2O$, $H_2O_2$, $N_2O$, $NO_2$, $O_3$, and organic peroxides. Mixtures of such chemicals can also be used. In other embodiment, the catalytical formation of an oxygen containing pulse can be provided by introducing into the reactor a pulse of vaporized aqueous solution of $H_2O_2$ and conducting the pulse over a catalytic surface inside the reactor and thereafter into the reaction chamber. The catalytic surface is preferably a piece of platinum or palladium. In some embodiments, excited species of an oxygen-containing compound (e.g., oxygen cations, oxygen anions, oxygen radicals) may be used, which can be formed using an in situ (or direct) or remote plasma (or radical) generator.

An oxygen-containing reactant is preferably selected from the group consisting of molecular oxygen, ozone and excited species of oxygen (e.g., oxygen cations, anions and/or radicals). In a preferred embodiment the oxygen-containing reactant is molecular oxygen. In some embodiments, the oxygen-containing reactant is pure molecular (diatomic) oxygen ($O_2$), but can also be a mixture of oxygen and inactive gas, for example, nitrogen or argon. As an example, the oxygen-containing reactant can be air. Excited species of oxygen may be formed in the reaction space comprising the substrate using an in situ plasma (or radical) generator, or in a remote plasma generator external to the reaction space comprising the substrate.

The second reactant is preferably pulsed for from about 0.05 to 10 seconds, more preferably for from 1 to 5 seconds, most preferably about for from 2 to 3 seconds. In some embodiments, the second reactant is pulsed from about 10 seconds to about 60 seconds, or even on the order of several minutes in some cases.

In some embodiments, such as in the deposition of a roughened metal on a high-k layer a thermal ALD process is used.

Gaseous precursors and/or gaseous by-products formed in the reaction between the precursors are removed from the reaction chamber by evacuating the chamber with a vacuum pump and/or by purging the gas from inside the reactor with the aid of an inert gas such as argon or nitrogen. Typical purging times are from about 0.05 to 20 seconds, more preferably between about 1 and 10, and still more preferably between about 1 and 2 seconds. However, it can be from about 10 seconds to about 60 seconds, or even on the order of minutes in some cases, like in batch reactors.

With continued reference to FIG. 1, it will be appreciated that with each successive cycle, metal will be deposited over portions of the surface modified in the second phase 20 and that the third and fourth phases 30 and 40 can be repeated as desired to achieve particles with desired particle size distributions. Thus, the third 30 and fourth 40 phases may be repeated 50 until a substrate comprising a surface of desired roughness is achieved 60. in some embodiments the third 30 and fourth 40 phases may be repeated between 10 and 100 times to achieve a desired surface roughness 60. In other embodiments, the third and fourth phases 30 and 40 are repeated in excess of 100 times, such as 1000 or 2000 times, to achieve a surface with desired roughness.

In some embodiments, the third 30 and fourth 40 phases are repeated until a surface roughness between about 0.5 to 100 nm (RMS roughness) is achieved, preferably between about 1.0 to 50 nm (RMS roughness), more preferably between about 2.0 to 30 nm (RMS roughness).

For some applications, like roughened bottom electrodes, ultimate particle sizes are preferably between about 5 nm and 100 nm, more preferably between about 10 nm and 50 nm. For bottom electrodes, the film is preferably continuously electrically conductive, though the film need not be physically continuous. In some cases, electron tunneling may occur, and in some cases the underlying layer may conduct electricity.

In alternative embodiments, in the second phase 20 the surface can be modified by blocking surface sites, thereby limiting metal deposition to primarily unblocked surface sites. Preferred blocking agents prevent reaction between blocked surface sites and a metal precursor. The blocking agent is preferably strongly bound to the surface such that displacement by the metal precursor is prevented. In such alternative embodiments the surface selected in the first phase 10 preferably includes a surface termination (e.g., OH groups) that is already reactive with a metal precursor. As an example, the surface may comprise an outermost $SiO_2$ layer comprising OH surface terminations.

A blocking agent, upon exposure to the surface, preferably reacts with and blocks isolated OH groups (or other reactive surface termination sites) on the surface. Preferred blocking agents include, without limitation, hexamethyldisilazane (HMDS) and other silazane group chemicals, and silicon compounds, such as silane group chemicals (e.g., organosilanes). Metal precursors are preferably more reactive with certain types of reactive sites, such as, OH groups than with, e.g., Si—O—Si bridge sites on the $SiO_2$ surface. Thus, in the third phase 30 on the metal precursor reacts with the OH terminated portions of the surface and not with blocked portions of the surface. Subsequent exposure to a second reactant, such as an oxygen-containing reactant (e.g., molecular oxygen or $H_2O$), in the fourth phase 40 produces a metal particle at the unblocked sites. Because water does not remove the blocking agent, this method can also be used to form metal oxide particles (e.g., alumina or iron oxide particles) if water is used as the oxidizing agent.

As discussed above, the third and fourth phases 30 and 40 may be repeated as desired to deposit metal or metal oxide particles with a desired distribution and, hence, a surface of desired roughness. In some embodiments the blocking agent preferably blocks about 50% or more, more preferably about 80% or more of the reactive sites that a particular precursor can subsequently react with. In some cases, if a low particle concentration is desired, the blocking agent can block about 95% or more (in some cases about 99.9% or more) of the reactive sites that a particular precursor can react with. The amount of blocking agent and the exposure time necessary to achieve the desired level of blocking, and hence the desired particle concentration, can be can be determined for particular circumstances through routine experimentation.

In other embodiments, roughened surfaces are be formed by choosing process conditions to promote particle agglomeration. Process conditions that can be selected to effect particle agglomeration include, without limitation, substrate temperature during deposition, heat treatment parameters and plasma parameters used to prepare an initial surface termination on the substrate surface prior to metal deposition.

Figure 2:
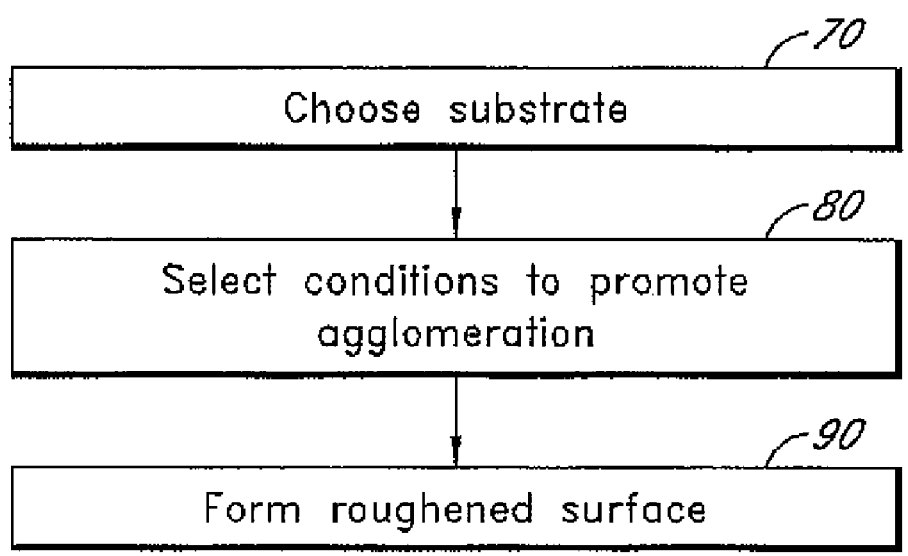

With reference to FIG. 2, a suitable substrate is selected 70 and placed into a reaction space. The substrate may be selected as described above in the context of FIG. 1. Next, process conditions are selected 80 to effect particle agglomeration. Next, the deposition process is carried out and a roughened surface is formed 90. In one embodiment, the roughened surface is formed by depositing a metal oxide and reducing the metal oxide at a temperature sufficient to cause particle agglomeration.

In some embodiments a metal oxide thin film can be formed on a substrate by ALD type processes. A typical ALD process comprises one or more pulsing cycles, each cycle comprising: pulsing a vaporized metal precursor into the reaction chamber to form at most a molecular monolayer (ML) of the metal precursor on the substrate, purging the reaction chamber to remove excess metal precursor and any reaction by-products, providing a pulse of a second reactant comprising an oxygen-containing reactant onto the substrate, purging the reaction chamber to remove excess second reactant and any gaseous by-products formed in the reaction between the metal precursor layer on the first surface of the substrate and the second reactant, and repeating the pulsing and purging steps until a metal oxide thin film of the desired thickness has been formed. In some embodiments, the oxygen-containing reactant is ozone ($O_3$). Additional description of methods that can be used for depositing metal oxide thin films are described in U.S. patent application Ser. No. 11/182,734 to Hamalainen et al., filed Jul. 15, 2005, the disclosure of which is entirely incorporated herein by reference. In other embodiments metal oxide thin films are deposited by other vapor phase deposition processes, such as CVD or PVD.

Next, the deposited metal oxide thin film is reduced to a metal thin film under conditions selected to effect particle agglomeration, thereby forming a roughened surface over the substrate. In some embodiments, the metal oxide thin film is contacted with a reducing agent preferably selected from the group consisting of alcohols (—OH), aldehydes (—CHO) and carboxylic acids (—COOH). In other embodiments reduction may be achieved using excited species of a reducing agent, such as, e.g., excited species of hydrogen. A description of methods for reducing metal oxide thin films to metal thin films can be found in U.S. Pat. No. 6,921,712 to Soininen et al., filed May 15, 2001, the disclosure of which is entirely incorporated herein by reference.

Reduction without particle agglomeration is typically achieved at a temperature in the range of 250° C. to 400° C., preferably 300° C. to 400° C., and in particular 310° C. to 390° C. In some cases, reduction can be done even below 250° C. and in other cases, substrate materials permitting, at temperatures up to 500° C. Here, in contrast, in preferred embodiments reduction is performed under conditions that promote metal agglomeration into three-dimensional particles on the substrate surface. Thus, the substrate is preferably reduced at a temperature sufficient to enable the metal particles to migrate on the substrate surface. In some embodiments, this temperature is about 50° C. higher than the standard reduction temperature (as described above), more preferably between about 50° C. and 400° C. higher than the standard reduction temperature, and still more preferably between about 100° C. and 250° C. higher than the standard reduction temperature. Thus, reduction to produce roughened films is preferably carried out at a temperature from about 300° C. to about 800° C., more preferably about 350° C. to 650° C. However, in some cases, depending on the composition of the metal oxide and the reducing agent, agglomeration may occur at a more typical reduction temperature, for example from about 250° C. to 400° C.

Surface roughening can also be effected by selecting a substrate surface material that promotes particle agglomeration and depositing metal particle using the process described above in the context of FIG. 1. In some embodiments, a metallic (or conductive) surface promotes particle agglomeration. In such a case, metal particles that preferentially interact with one another as opposed to a substrate surface will form three-dimensional islands on the surface of the substrate.

Process conditions can also be chosen to provide an initial surface termination that promotes particle agglomeration. In one embodiment, a plasma step is used to treat the surface prior to metal deposition and plasma parameters are selected to produce a surface with a desired concentration of termination sites. Plasma parameters include, without limitation, RF power, RF frequency, plasma pulse time and plasma power on time. In another embodiment, the substrate may be heated (or annealed) to effect a particular surface termination concentration. Heat treatment parameters include, without limitation, substrate temperature and heating time.

Figure 3:
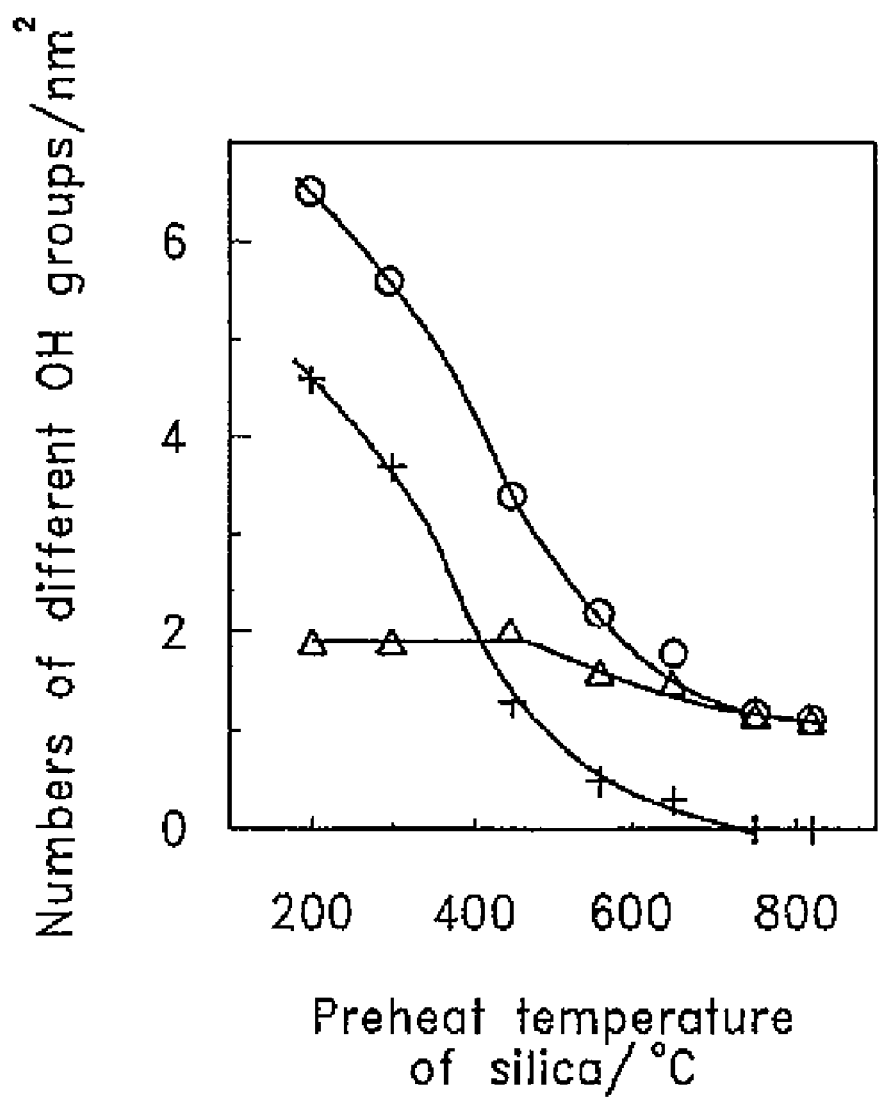
FIG. 3 is a two-dimensional plot showing the concentration of OH groups on a silica surface at various preheating temperatures.

In some embodiments, the concentration of initial surface termination sites can be determined by annealing at an appropriate temperature. As an example, FIG. 3 illustrates how the concentration of OH groups ("groups/$nm^2$," as illustrated) on a silica surface is related to the annealing temperature ("Preheat temperature," as illustrated). With increasing annealing temperature, the concentration of OH groups decreases. Thus, the concentration of OH groups (and hence the eventual concentration of islands and therefore surface roughness) can be selected as desired by choosing an appropriate annealing temperature.

In either case, once the desired concentration of reactive sites has been acheived a roughened surface may be subsequently formed by the deposition methods outlined above. Thus, in one embodiment, the surfaces may be exposed to alternating or sequential pulses of a metal source chemical and an oxygen-containing species to form metal oxide particles, followed by treatment with a reducing agent to form metal particles. In another embodiment, the surfaces may be treated with a halide or metalorganic compound to further enhance deposition, and subsequently processed with alternating and sequential pulses of a metal source chemical and an oxygen-containing reactant to form metal particles.

In a particular example, plasma treatment or heat treatment may be used to produce a particular distribution of OH groups over an $SiO_2$ surface. The OH groups serve as reactive sites for metal precursors. The surface is subsequently exposed to alternating and sequential pulses of a metal source chemical and an oxygen-containing reactant to deposit metal particles over OH terminated sites on the surface.

Suitable metal precursors may be selected by the skilled artisan. In general, metal compounds where the metal is bound or coordinated to oxygen, nitrogen, carbon or a combination thereof are preferred. As described above, in some embodiments the metal precursors are organic compounds. More preferably betadiketonate compounds are used. In some embodiments, $X(acac)_3$ or $X(thd)_y$ compounds are used, where X is a metal, y is generally, but not necessarily between 2 and 3 and thd is 2,2,6,6-tetramethyl-3,5-heptanedionato.

The oxygen source may be an oxygen-containing gas pulse and can be a mixture of oxygen and inactive gas, such as nitrogen or argon. In some embodiments the oxygen source may be a molecular oxygen-containing gas pulse. Sources of oxygen include air and a gas mixture with a higher concentration of oxygen than air. In preferred embodiments the oxygen source comprises an activated or excited oxygen species. In some embodiments the oxygen source comprises ozone. The oxygen source may be pure ozone or a mixture of ozone and another gas, for example an inactive gas such as nitrogen or argon. In other embodiments the oxygen source is oxygen plasma. In yet other embodiments, the oxygen source is water.

The ALD methods disclosed herein can be performed in any reactor, reaction chamber or reaction space configured for ALD. Examples of suitable reactors that may be used for the deposition of metals according to the processes of the present invention include commercially available ALD equipment, such as the F-120® reactor, Pulsar® reactor and EmerALD™ reactor, available from ASM America, Inc of Phoenix, Ariz. In addition to these ALD reactors, many other kinds of reactors capable of ALD growth, including CVD reactors equipped with appropriate equipment and means for pulsing the precursors, can be employed. Preferably, reactants are kept separate until reaching the reaction chamber, such that shared lines for the precursors are minimized. However, other arrangements are possible, such as the use of a pre-reaction chamber as described in U.S. application Ser. Nos. 10/929, 348, filed Aug. 30, 2004 and 09/836,674, filed Apr. 16, 2001, which is incorporated herein by reference.

Reactors are preferably kept under vacuum. The pressure in the reaction chamber is typically between about 0.01 and 20 mbar, more preferably between about 1 and 10 mbar.

The deposition processes can optionally be carried out in a reactor or reaction space connected to a cluster tool. Because each reaction space is dedicated to one type of process in a cluster tool, the temperature of the reaction space in each module can be kept constant. This improves the throughput compared to a reactor in which is the substrate is heated up to the process temperature before each run. In addition, pump time is saved if the transfer area behind a load lock is maintained at a low base pressure.

Although generally described herein in relation to ALD processes, the skilled artisan will recognize that the surface modification can be utilized to selectively deposit metals in other deposition processes, such as chemical vapor deposition (CVD) processes. In addition to enhancing nucleation, surface treatment can allow lower deposition temperatures. As in the ALD reactions described in detail herein, surface treatment, such as halide treatment for CVD, would include the provision of a halide or metalorganic reactant to the reaction space prior to the regular CVD process.

Forming Integrated Circuit (IC) Components

A method for forming integrated circuit components (e.g., a capacitor or memory unit) comprises forming a roughened substrate surface comprising islands of conductive material, such as metal or conductive metal oxide and subsequently depositing a gate dielectric layer over the roughened surface. The islands may be formed according to the methods described above.

Figure 4:
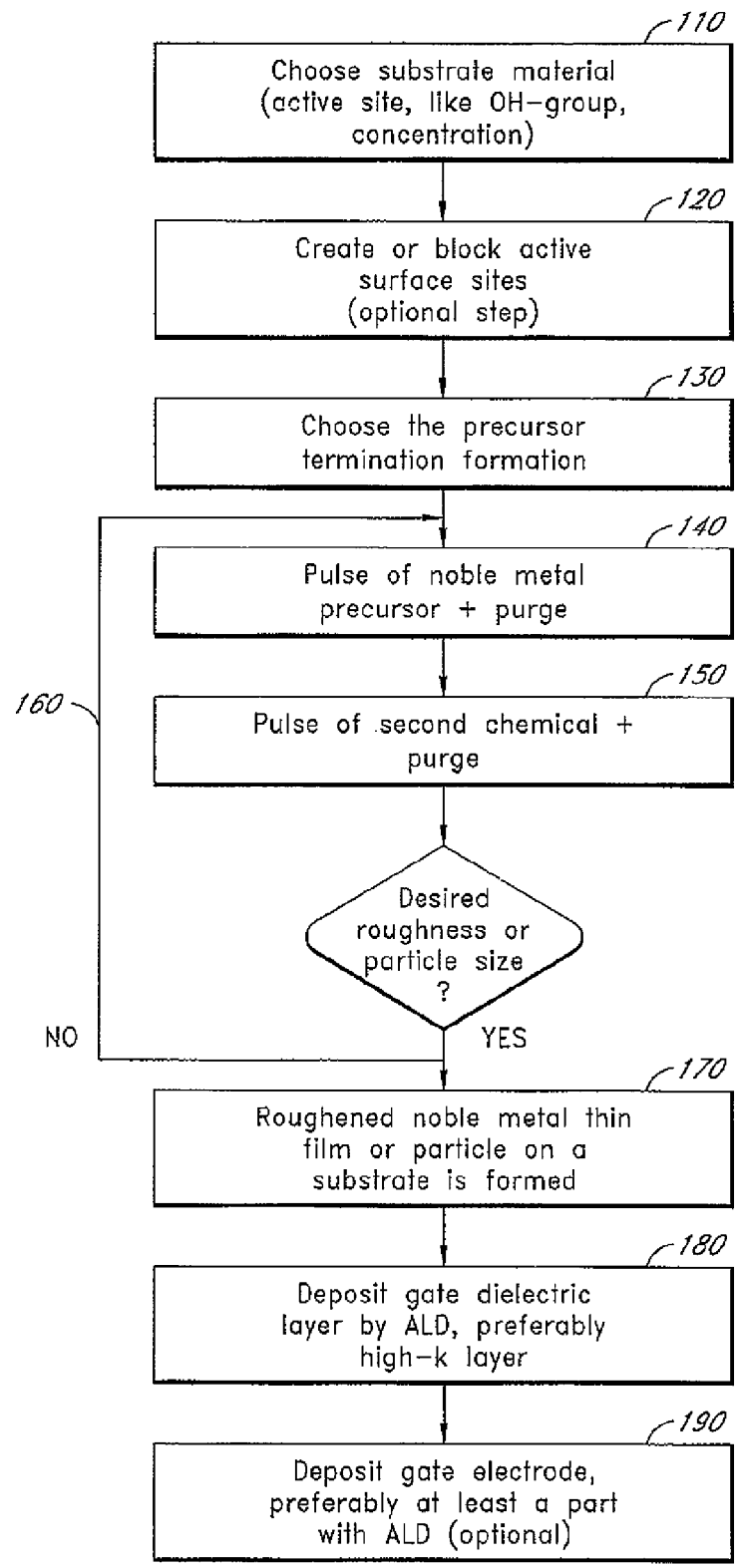
FIGS. 4 and 5 are process flow diagrams for forming integrated circuit (IC) components, according to other embodiments of the invention.

With reference to FIG. 4, a substrate is selected 110 and inserted into a reaction space configured for ALD. Next, active surface sites are optionally created or blocked on the surface on which deposition is desired 120. A precursor for creating the desired surface termination is selected and pulsed 130 into the reaction space. Next, metal or metal oxide particles are deposited by alternately and sequentially pulsing a metal precursor 140 and a second reactant 150 into the reaction space. The second reactant may be an oxygen-containing reactant, as described above. The reaction space is purged and/or pumped down between pulses 140 and 150. Pulses 140 and 150 may be repeated 160 until a thin film with a desired concentration of islands (i.e. a desired surface roughness) is achieved 170. The metal oxide may be a conductive metal oxide. In other embodiments a metal oxide may subsequently be reduced to an elemental metal.

Next, a gate dielectric layer, preferably a high-k layer, is deposited 180 over the roughened surface, preferably by an ALD process. Exemplary ALD processes for depositing a high-k layer are described in U.S. patent application Ser. No. 09/787,062 to Leskela et al., filed Jun. 28, 2001, U.S. patent application Ser. No. 11/318,092 to Hatanpaa et al., filed Dec. 22, 2005, and U.S. Pat. No. 6,780,704 to Raaijmakers et al., filed Dec. 3, 1999, the disclosures of which are entirely incorporated herein by reference. An optional gate electrode may be deposited 190 on the gate dielectric layer. Preferably, at least a portion of the gate electrode is deposited by an ALD process.

Figure 5:
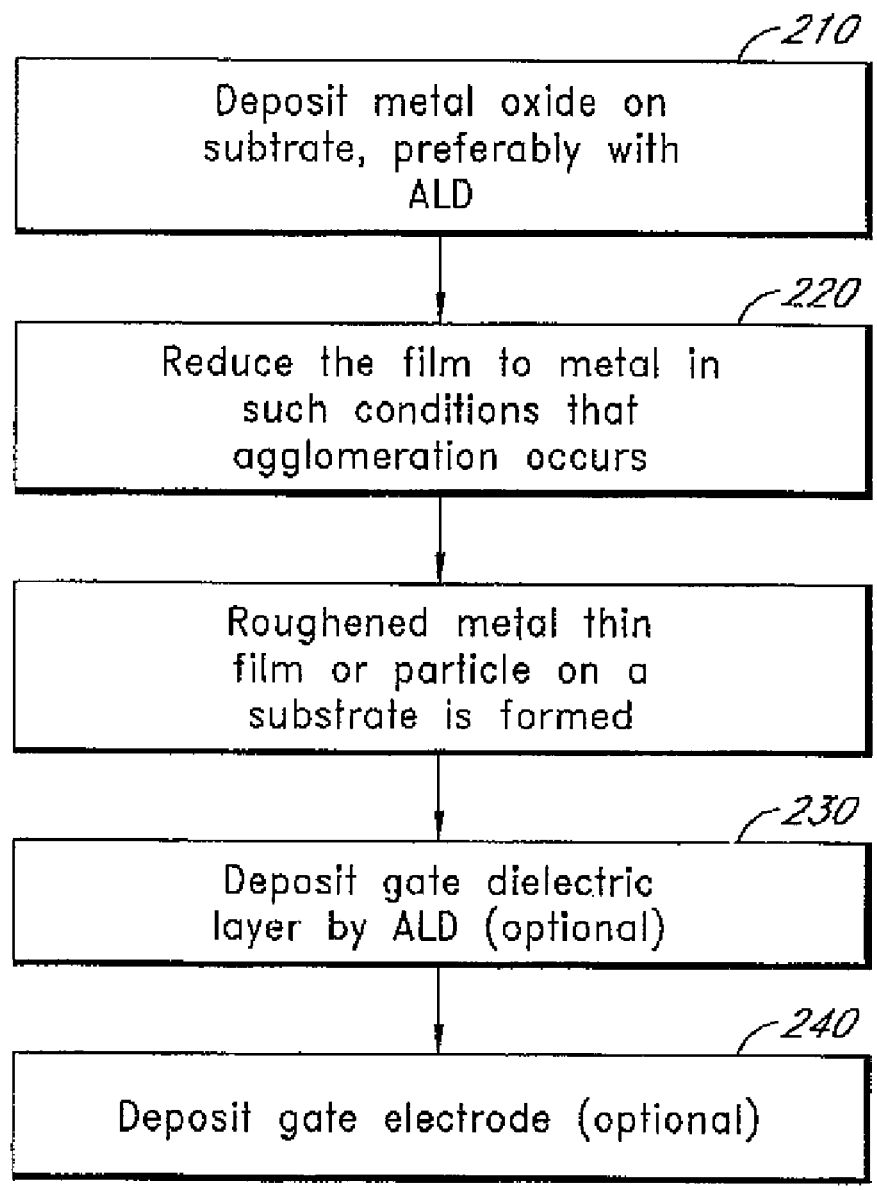

An alternative method for forming a capacitor or memory unit in an integrated circuit is shown in FIG. 5. The method comprises depositing a metal under one or more process conditions selected to promote particle agglomeration and subsequently depositing a gate dielectric layer over the roughened surface. In other embodiments a metal oxide is deposited and reduced under conditions that promote agglomeration.

With reference to FIG. 5, a metal oxide layer is deposited 210 on a substrate in a reaction space, preferably by an ALD process comprising alternately and sequentially pulsing a metal source chemical and an oxidizing agent (e.g., $O_2$). Next, the metal oxide layer is reduced 220 to a metal layer under conditions (e.g., temperature and/or pressure) to promote metal particle agglomeration on the substrate surface, thereby forming a roughened surface overlying the substrate. The metal oxide thin film is preferably reduced at a substrate temperature between about 100° C. and 500° C., more preferably between about 200° C. and 400° C. Next, a gate dielectric layer, preferably a high-k layer, is deposited 230 over the roughened surface, preferably by an ALD process. An optional gate electrode may be deposited 240 on the gate dielectric layer, preferably at least in part by an ALD process.

EXAMPLE 1

Substrates comprising thermal oxide, native oxide and alumina surfaces (OH terminated surfaces) were exposed to $SiCl_4$, thereby forming chlorine-terminated surfaces. The substrates were exposed to a metal source chemical in an ALD process to form metal thin films comprising multiple distinct particles. Each of the thin films had different film properties (e.g., particle sizes) due to different hydroxyl-group (active surface site) concentrations. Since a halide chemical, like $SiCl_4$, can chemisorb on hydroxyl groups, a different concentration of halide termination sites was formed on each of the surfaces, which in turn produced thin films with different film properties.

EXAMPLE 2

A roughened surface comprising discrete particles of uniform size, such nanocatalyst particles, is formed by ALD. Most metal compounds can utilize only the Si—OH groups on the $SiO_2$ surface, not the Si—O—Si bridges. Thus, the concentration of Si—OH groups on the surface of a chemical oxide (e.g., $SiO_2$ formed on the surface of a silicon wafer by heat treatment in the presence of water) is controlled to provide the desired density of Si—OH reactive sites. The surface is then exposed to a metal source chemical and second reactant in an ALD cycle. Because a substantial portion of the $SiO_2$ surface is covered by Si—O—Si groups, a non-uniform distribution of metal or metal oxide particles on the surface is produced.

EXAMPLE 3

An $SiO_2$ surface is formed on a silicon wafer by heat treating the silicon wafer in the presence of water. This surface is then heat treated to 200° C. to produce strongly H-bonded and isolated Si—OH groups on the surface. The $SiO_2$ surface is subsequently exposed to HMDS (hexmethyldisilazane) to selectively block (or remove) isolated OH groups, forming O—$Si(CH_3)_3$ upon reaction. Next, the silylated (—O—$Si(CH_3)_3$) surface is exposed to a metal source chemical, which reacts with unblocked (or unsilylated) portions of the surface. The surface is subsequently contacted with water to form a metal oxide thin film on unblocked portions of the surface. Since water cannot remove the hydrophobic silylated species from the surface, this process can be repeated to selectively deposit metal oxide (or metal) nanoparticles on the surface.

EXAMPLE 4

An $SiO_2$ surface is heat treated to remove most of the H-bonded OH groups from the surface, leaving only isolated Si—OH groups. The heat treatment temperature is preferably 400° C. or higher. The surface is exposed to HMDS to block the Si—OH groups and to form the hydrophobic silylated surface (—O—$Si(CH_3)_3$). Next, the surface is exposed to $Al(CH_3)_3$, which reacts with the Si—O—Si surface sites to form Si—O—$Al(CH_3)_2$ and Si—$CH_3$ surface species. The Si—O—$Al(CH_3)_2$ surface is then treated with water to form Al—OH sites that can serve as active sites for other metal compounds. Water is preferably used as a second reactant. For example, catalytic metal nanoparticles can be formed on the surface by ALD growth with the water as the non-metal compound. Note that most of the $SiO_2$ surface is covered by Si—O—Si groups. By this process almost the entire $SiO_2$ surface can be utilized.

It will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A method for forming a roughened surface on a substrate, comprising:
   depositing a metal oxide film on the substrate; and
   reducing the metal oxide at a temperature at which agglomeration occurs.

2. The method of claim 1, wherein the temperature at which the metal oxide is reduced is between 350° C. and 650° C.

3. The method of claim 1, wherein reducing comprises exposing the metal oxide to a reducing agent selected from the group consisting of alcohols (—OH), aldehydes (—CHO) and carboxylic acids (—COOH).

4. The method of claim 1, wherein the metal oxide is deposited by an atomic layer deposition (ALD) process.

5. The method of claim 1, wherein the roughened surfaced selectively forms on one surface of the substrate relative to a second surface of the substrate.

6. The method of claim 1, wherein the temperature at which the metal oxide is deposited is from about 250° C. to about 400° C.

7. The method of claim 1, wherein the substrate temperature when reducing the metal oxide is from about 250° C. to about 400° C.

8. The method of claim 1, wherein the roughened surface comprises islands.

9. The method of claim 8, wherein the islands comprise particles or grains.

10. The method of claim 8, further comprising deposition of nanotubes on the roughened surface.

11. The method of claim 1, wherein the deposited metal oxide film is conformal.

12. The method of claim 4, wherein the ALD process involves surface saturation of the available reactant sites.

13. The method of claim 1, wherein the deposited metal oxide film is smooth prior to reduction.

14. The method of claim 1, wherein reducing comprises exposing the metal oxide to an excited species of hydrogen.

15. The method of claim 1, wherein the reduced metal oxide layer that forms the roughened surface is not continuous.

16. The method of claim 1, wherein the metal oxide is reduced to elemental metal.

17. The method of claim 1, wherein the reduced metal oxide comprises one or more of Cr, Cu, Ni, Fe, Co, Zn, Ru, Rh, Pd, Ag, Re, Os, Ir, Pt, Mo and W.

18. The method of claim 1, wherein the substrate comprises a surface material that promotes agglomeration prior to depositing the metal oxide.

19. The method of claim 1, wherein the substrate is treated with plasma to form a surface termination that promotes agglomeration prior to depositing the metal oxide.

20. The method of claim 1, wherein the substrate is annealed to form a hydroxyl surface termination that promotes agglomeration prior to depositing the metal oxide.

21. The method of claim 1, further comprising depositing a dielectric layer over the roughened surface.

22. A method for forming a roughened surface on a substrate, comprising:
   depositing a metal oxide on the substrate by providing vapor phase reactants to the substrate; and
   reducing the metal oxide at a temperature at which agglomeration occurs.

* * * * *